United States Patent [19]
Watanabe et al.

[11] Patent Number: 5,534,809
[45] Date of Patent: Jul. 9, 1996

[54] PULSE PHASE DIFFERENCE ENCODING CIRCUIT

[75] Inventors: Takamoto Watanabe, Nagoya; Seiki Aoyama, Toyohashi, both of Japan

[73] Assignee: Nippondenso Co., Ltd., Kariya, Japan

[21] Appl. No.: 212,117

[22] Filed: Mar. 14, 1994

[30] Foreign Application Priority Data

Mar. 26, 1993 [JP] Japan ................................ 50-68019

[51] Int. Cl.$^6$ .................................................. H03B 27/00
[52] U.S. Cl. ...................... 327/269; 327/400; 377/124; 377/126; 331/45; 331/57
[58] Field of Search ................................ 327/3, 261, 400, 327/565, 269; 331/57, 45; 377/126, 124, 122

[56] References Cited

U.S. PATENT DOCUMENTS

| | | | |
|---|---|---|---|
| 5,126,691 | 6/1992 | Mijuskovic et al. | 331/45 |
| 5,128,624 | 7/1992 | Hoshino et al. | 327/3 |
| 5,134,371 | 7/1992 | Watanabe et al. | 324/252 |
| 5,166,959 | 11/1992 | Chu et al. | 377/20 |
| 5,262,735 | 11/1993 | Hashimoto et al. | 331/57 |
| 5,302,920 | 4/1994 | Bitting | 331/57 |

OTHER PUBLICATIONS

T. Rahkonen et al., "Time Interval Measurement Using Integrated Tapped CMOS Delay Lines", Dept. of Electrical Engineering, University of Oulu, Finland, p. 201–205, 1990.

*Primary Examiner*—Timothy P. Callahan
*Assistant Examiner*—Terry L. Englund
*Attorney, Agent, or Firm*—Cushman, Darby & Cushman

[57] ABSTRACT

A pulse phase difference encoding circuit includes a ring delay pulse generating circuit which is formed by a NAND circuit and inverters. Signal lines connecting the NAND circuit and the inverters have uniform load capacity to obtain even time resolutions. The NAND circuit is formed by component transistors one of which is larger in size to have the same delay time as the other inverters. A dedicated latch buffer for applying steeply changing drive pulse to a pulse selector is provided to prevent difference in the measurements. A specific value is outputted in the event of the overflow or underflow of the measurement time to obtain a constant digital output.

26 Claims, 11 Drawing Sheets

PULSE PHASE DIFFERENCE ENCODING CIRCUIT

BACKGROUND OF THE INVENTION

1. Field of the Invention

The present invention relates generally to circuit detecting a phase difference between two pulse signals in any phase relation, and more particularly, to a pulse phase difference encoding circuit capable of detecting the phase difference with high precision over a wide range.

2. Description of Related Art

A pulse phase difference encoding circuit designed to convert a phase difference (or a time difference) between two pulse signals into a code (or a numerical value) has been disclosed in, for example, U.S. Pat. No. 5,128,624 to Hoshino et al. This conventional pulse phase difference encoding gate includes delay elements comprising a ringed connection of a NAND circuit and a plurality of inverters, circulates a first pulse signal inputted therein at any timing through the ringed connection, counts the number of such circulations on one hand, and specifies the position of the circulation of the first pulse signal in the ringed connection at a timing of the input of a second pulse signal on the other hand, and detects the phase difference between the two pulse signals based on the specified position and the counted number of circulations. However, the above conventional pulse phase difference encoding circuit has the following problems.

Firstly, a ring delay pulse generating circuit having the ringed connection of the plurality of delay elements connects the output from the delay element in the last stage to the delay element in the first stage with a signal line (i.e. a conductive strip in an integrated circuit) to complete the ring. When the signal line connecting the delay element in the last stage to the delay element in the first stage (hereinafter referred to as the "B signal line") and the signal lines connecting the other delay elements to each other (hereinafter referred to as "A signal lines") are compared with each other, the A signal lines may become longer than the B signal line in some cases.

For example, as seen in the circuit layout diagram of the ring delay pulse generating circuit illustrated in FIG. 13, when a plurality of D-type flip-flops (hereinafter referred to as "DFFs") forming a pulse selector 20 are laid out within the ringed wiring of the NAND gate and inverters IN1 through IN62 each of which serves as a delay elements of the pulse phase difference encoding circuit, a difference occurs in the lengths between the signal line A connecting the straight portion through a plurality of delay elements from the first stage, the signal line B1 connecting the turn portion between the inverter IN31 in the intermediate portion of the ring and the inverter IN32 in the intermediate portion of the ring, and the signal line B2 connecting the turn portion between the last inverter IN62 and the NAND circuit.

In the above arrangement, assuming the signal lines have a uniform line width, the load capacitance of the signal lines B1 and B2 are larger than the load capacitance of the signal line A, and as a result, the delay time in the pulse phase difference encoding circuit is uneven. Consequently, as illustrated in FIG. 14, a difference occurs in time resolutions a, b1 and b2 (representing a digital output value from, e.g., inverter IN1, digital output value of "31" corresponding to the signal line B1 between the inverters IN31 and IN32, and a digital output value of "62" corresponding to the signal line B2 between the inverter IN62 and the NAND gate, respectively), and the time resolutions are thereby degraded. In this case, the time resolutions a, b1 and b2 illustrated in FIG. 14 are determined by the dimensions of the signal lines A, B1 and B2, respectively. Furthermore, the load capacitance of the signal lines are proportional to the widths and lengths of the signal lines. In FIG. 14, however, the widths of the signal lines are assumed to be equal to each other, and only the lengths thereof are assumed to be different from each other.

Secondly, the above conventional pulse phase difference encoding circuit uses the NAND gate and the inverters IN as delay elements forming a ring delay pulse generating circuit. Normally, however, since the switching speed of the NAND gate is slower than that of the inverters IN, a difference in the signal delay speed is caused, and the time resolutions are uneven.

Thirdly, the above conventional pulse phase difference encoding circuit is responsive to latch pulses driving the pulse selector and the counter DFF. Normally, the second pulse signal PB is inputted into a pulse selector and a counter DFF through a buffer. In many practical applications, however, as illustrated in FIG. 16, latch pulses PB1 for the pulse selector and clock pulses for driving the DFFs in the other blocks, such as a digital filter 101A and a digital comparator 102A, are all output signals from the buffer 90. That is, the buffer 90 for the latch pulses of the pulse selector drives the other circuits as well. For this reason, the buffer 90 has a large loading capacitance, and as a result, the transition of PB1 between logic levels is not steep and the measurements are uneven.

Fourthly, the above conventional pulse phase difference encoding circuit has no measures to counter a case where the measurement time exceeds the upper limits of the measurement range (overflow) or aberrations where the second pulse signal is inputted prior to the input of the first pulse signal (underflow), both cases being expected when the conventional pulse phase difference encoding circuit is used in connection with a sensor. Therefore, as illustrated in FIG. 15, the digital outputs are uneven.

SUMMARY OF THE INVENTION

The first object of the present invention is to obtain even time resolutions in a pulse phase difference encoding circuit by making delay times of signal lines in a ring delay pulse generating circuit equal to each other.

A second object of the present invention is to obtain even time resolutions in a pulse phase difference encoding circuit by making the signal delay speeds or switching speeds of NAND circuits and inverters equal to each other.

A third object of the present invention is to prevent unevenness in the measurements of a pulse phase difference encoding circuit by making input pulse changes steep.

A fourth object of the present invention is to obtain constant digital outputs by providing an appropriate value in the event of overflow or underflow of measurement time.

In order to achieve the above first object, a pulse phase difference encoding circuit according to the present invention inputs a first pulse signal and passes the first pulse signal through a delay pulse generating circuit comprising a plurality of delay elements where the last delay element to the first delay element is connected and inputs a second pulse signal delayed from the first pulse signal, and specifies the positions of the plurality of delay elements through which the first pulse signal passes at the timing of the input of the second pulse signal and thereby encodes any delay time based on the number of the delay elements through which the first pulse signal has passed to make load capacitances of the signal lines connecting the plurality of delay elements substantially equal to each other.

By setting load capacitances of the signal lines connecting the plurality of delay elements to be equal in the above arrangement, the delay time which is subject to the effects of the signal lines is made equal or uniform, and thereby equal time resolutions can be obtained. As the load capacitance of each signal line is proportional to the width and length of the signal line, the relation between the width and length of the signal line should be considered in determining the load capacity.

In order to achieve the above second object, the pulse phase difference encoding circuit according to the present invention inputs the first pulse signal and passes the first pulse signal through a delay pulse generating circuit comprising a plurality of first delay elements and a set of second delay element where the last of the first delay elements is connected to the second delay element inputs the second pulse signal delayed from the first pulse signal, and specifies the positions of a plurality of delay elements through which the first pulse signal passes at the timing of the input of the second pulse signal and thereby encodes the any delay time based on the number of the delay elements through which the first pulse signal has passed to make the delay time in passing through the NAND circuit and the delay time in passing through the inverters substantially equal to each other.

By setting the propagation time of the NAND circuit and the propagation delay time of the inverters to be equal in the above arrangement, the delay time which is subject to the effects of the delay elements is made even, and thereby even time resolutions can be obtained. If the NAND circuit and the inverters comprise transistors, the second object can be achieved also by changing the transistor sizes.

In order to achieve the above third object, the pulse phase difference encoding circuit according to this invention comprises a delay pulse generating circuit which connects a plurality of delay elements together, passes the first pulse signal through the delay elements and repetitively generates a plurality of delay pulses one after another delayed by the delay times of the delay elements through which the first pulse signal has passed; a pulse selector which is synchronous with the input timing of the second pulse signal having a phase difference from the first pulse signal and selects one of the delay pulses in a specific relation to the phase difference from the delay pulse generating circuit; and a dedicated latch buffer which inputs the second pulse signal and generates a latch pulse signal to independently drive the pulse selector.

Furthermore, this pulse phase difference encoding circuit may comprise a counter which counts the number of circulations of the first pulse signal through the delay pulse generating circuit and a counter flip-flop which takes in the output from the circulation counter and outputs signal corresponding to the number of circulations in synchronization with the timing of the input of the second pulse signal to allow the latch pulses generated by the dedicated latch buffer to drive the counter flip-flop.

By providing the dedicated latch buffer which inputs the second pulse signal and generates a latch pulse signal to independently drive the pulse selector in the above arrangement, the load capacity of the dedicated buffer is reduced, and thereby the change in the pulse outputted from the pulse selector can be made steep. Furthermore, as the dedicated buffer also drives the counter flip-flop, the change in the pulse outputted from the counter flip-flop can be made steep as well.

In order to achieve the above fourth object, the pulse phase difference encoding circuit according to the present invention inputs the first pulse signal, passes the first pulse signal through a plurality of delay elements and inputs the second pulse signal delayed from the first pulse signal, and specifies the positions of a plurality of delay elements through which the first pulse signal passes at the timing of the input of the second pulse signal and thereby encodes the delay time based on the number of the delay elements through which the first pulse signal has passed. In this arrangement, the pulse phase difference encoding circuit comprises a judgment section for judging whether the delay time is within the measurement range in the pulse phase difference encoding circuit and an output section for outputting the delay time as a specific value when the judgment means determines that the delay time is not within the measurement range.

Furthermore, in this arrangement, even if the time from the input of the first pulse signal to the input of the second pulse signal is outside the measurement range, a specific value will be output, and therefore, digital output will be constant and the constant digital outputs can be consistently obtained always.

DETAILED DESCRIPTION OF THE PREFERRED EMBODIMENTS

A preferred embodiment of a pulse phase difference encoding circuit according to the present invention will now be described referring to FIGS. 1 through 12.

Figure 1:
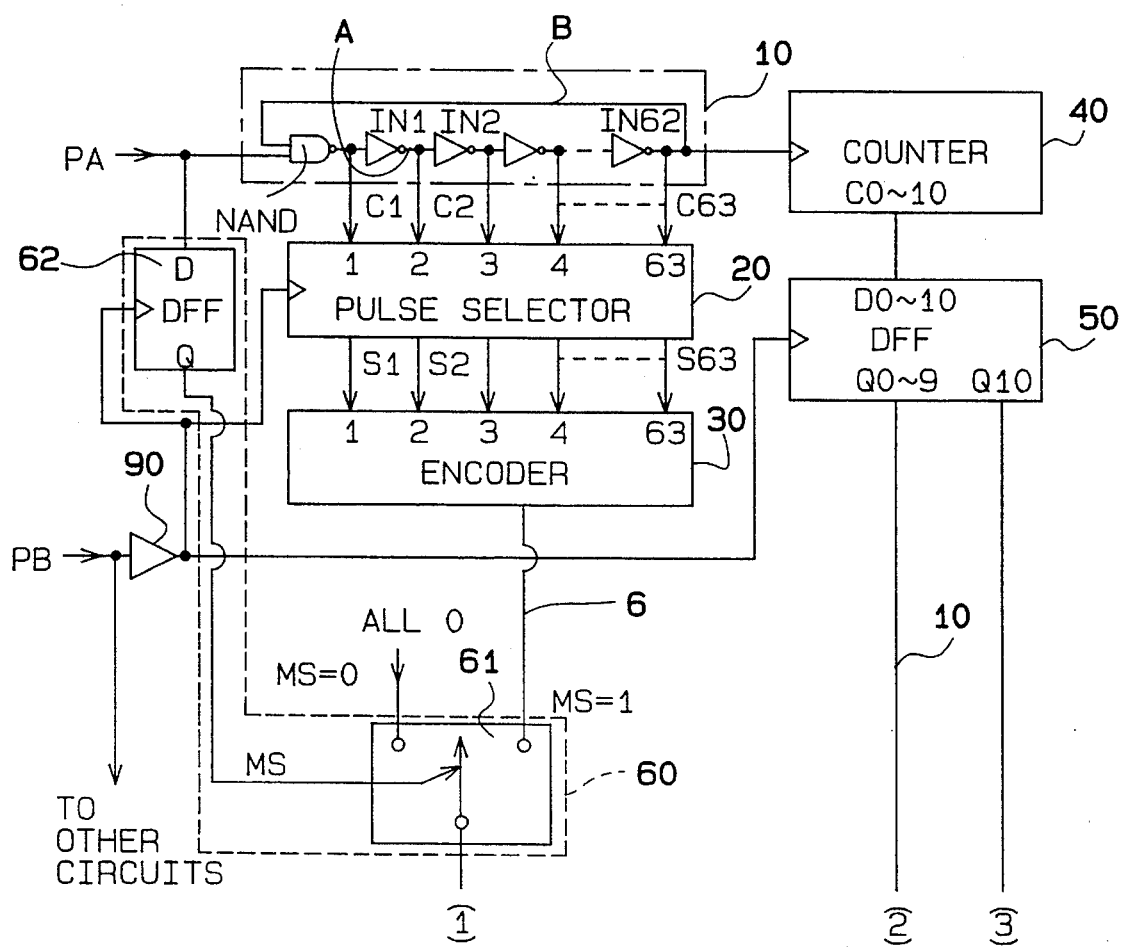
FIG. 1 is a block diagram illustrating a portion of a configuration of an embodiment of the present invention.
Figure 2:
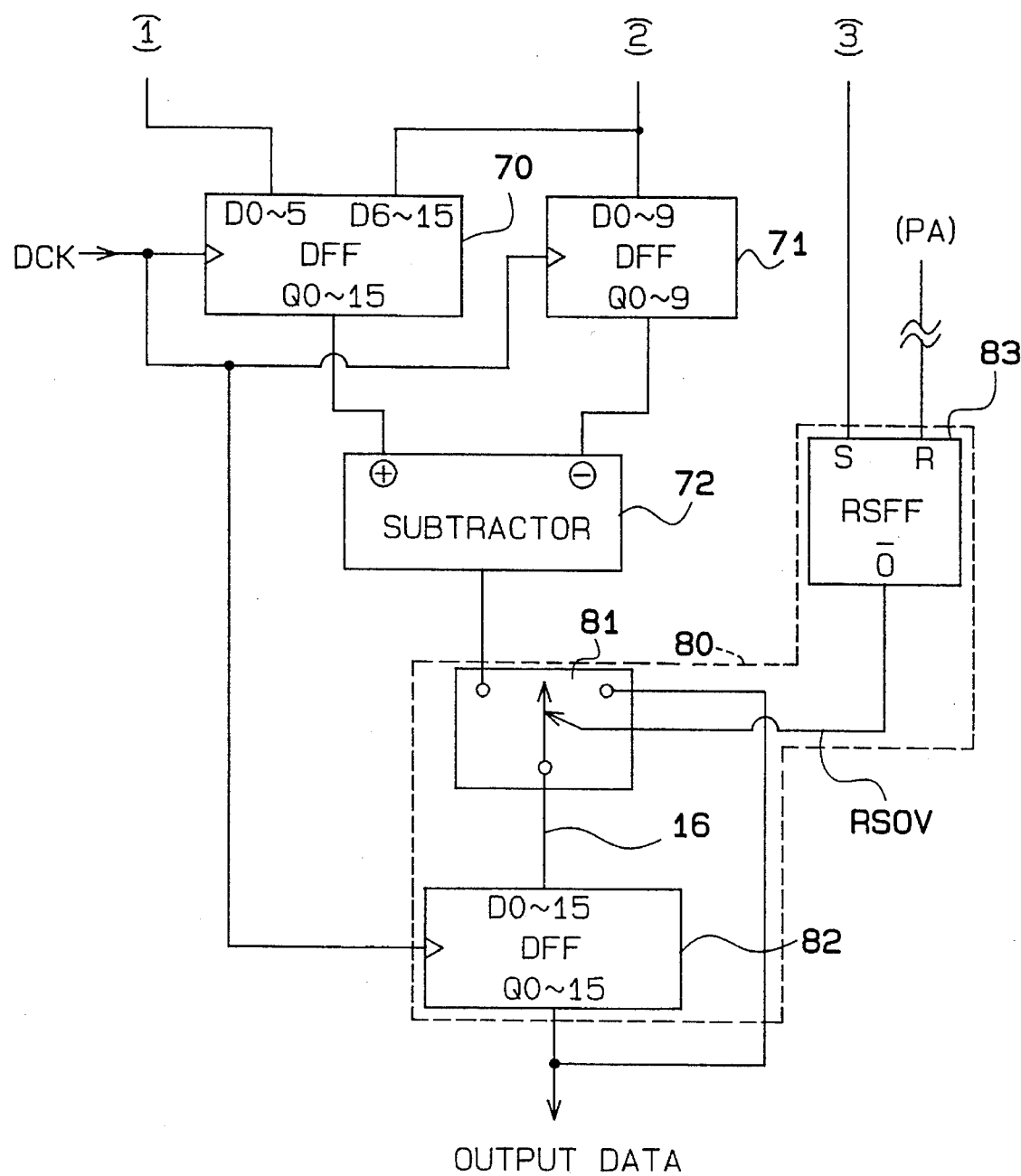
FIG. 2 is a block diagram illustrating a portion of a configuration of the first embodiment.

The pulse phase difference encoding circuit illustrated in FIGS. 1 and 2 includes a ring delay pulse generating circuit 10, a pulse selector 20, an encoder 30, a circulation counter 40, a counter DFF 50, an underflow limiter circuit 60, output DFFs 70 and 71, a subtractor 72 and an overflow limiter circuit 80.

Here, FIGS. 1 and 2 are one complete circuit diagram and are connected to each other corresponding at points (1), (2) and (3).

Figure 3:
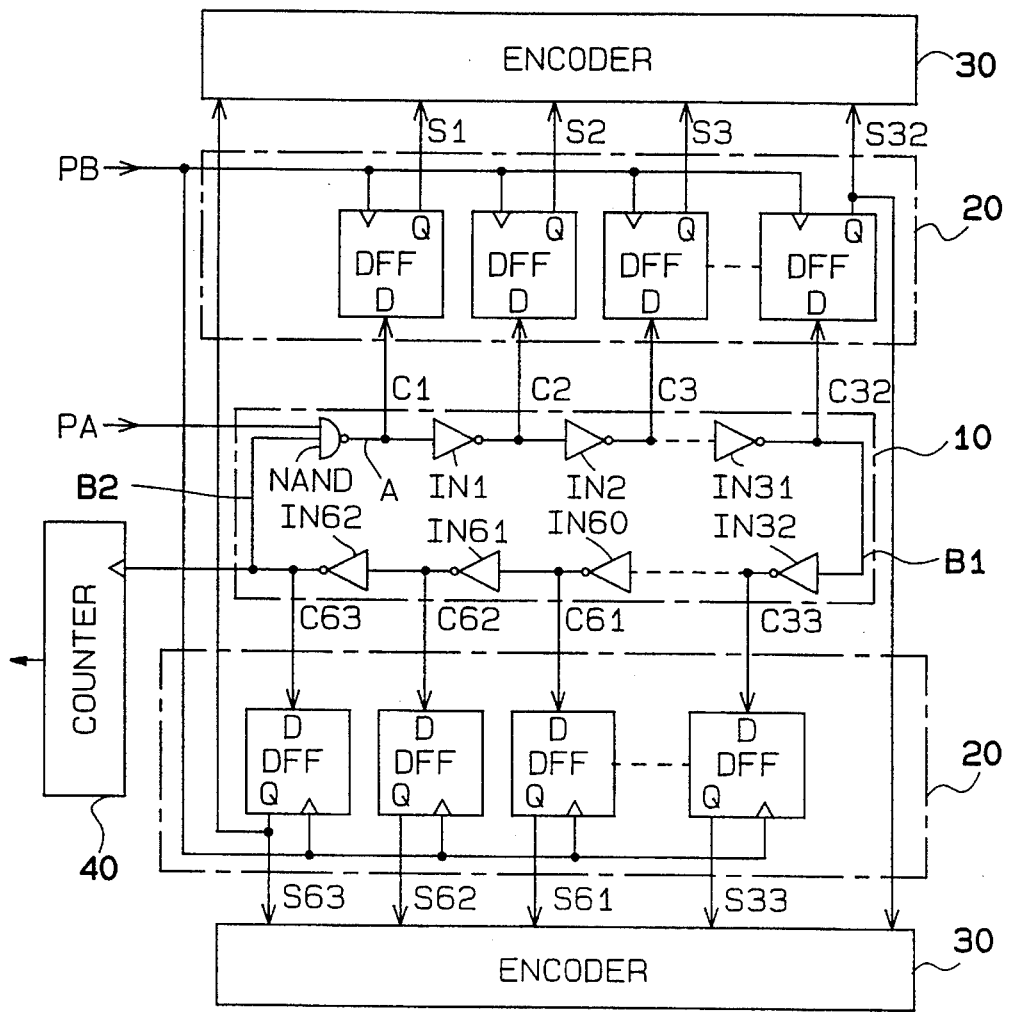
FIG. 3 is a schematic of a ring delay pulse generation circuit of a first embodiment.

Each circuit component will now be described in detail:

In the ring delay pulse generating circuit 10 illustrated in FIG. 3, a NAND gate and inverters IN1 through IN62 as delay elements are continuously and serially connected by signal lines A and B (B1 and B2), and the output from the inverter IN62 in the last stage is connected to the NAND gate in the first stage. In operation, when the first pulse signal PA is inputted, phase difference pulses C1 through C63 are outputted to the pulse selector 20 one after another every time the first pulse signal is delayed while passing through each inverter from IN1 through the NAND gate and IN62.

The pulse selector 20 comprises 63 DFFs connected to the signal lines A and B. When the second pulse signal PB is inputted, the pulse selector 20 selects one of the phase difference pulses C1 through C63 being outputted from the ring delay pulse generating circuit 10 at that timing and outputs selection signals S1 through S63.

The encoder 30 receives an input of the selection signal from the pulse selector 20 and outputs a 6-bit binary digital signal as a phase difference signal corresponding to the received selection signal.

The circulation counter 40 is connected to the last inverter IN62 of the ring delay pulse generating circuit 10, and counts the number of the circulations of the first pulse signal PA and outputs an 11-bit binary digital signal as a circulation signal.

Referring to FIGS. 1 and 2 again, the counter DFF 50 is connected to the circulation counter 40, and when it receives an input of the second pulse signal PB, it outputs a circulation signal of the circulation counter 40. Here, if the circulation counter 40 has counted up to the maximum number of counts, the counter DFF 50 will output an overflow signal from an output terminal Q10 thereof. That is, if the circulation signal from the circulation counter 40 has reached the maximum number of bits (11 bits), the counter DFF 50 will output "1" as an overflow signal to the output terminal Q10.

The output DFF 70 receives an input of a phase difference signal or an underflow signal (6 bits) as least significant bits from the encoder 30 and a circulation signal (10 bits) as most significant bits from the counter DFF 50. When receiving a clock signal DCK, the output DFF 70 outputs a 16-bit output signal combining the above lower and upper bits.

The output DFF 71 and the subtractor 72 provide phase difference output compensation. The subtractor 72 subtracts the output signal from the output DFF 71 from the output signal from the output DFF 70, compensates the actual phase difference time "n+63N" and outputs the compensated output signal.

Here, n is a denotation of the decimal value of the output from the encoder 30 and an integral number from 1 through 63 based on the number of the inverters. N is a decimal value of the output from the counter DFF 50. Therefore, in the output DFF 70, when the signal from the encoder 30 is simply inputted as least significant bits and the signal from the counter DFF 50 is simply inputted as most significant bits (7 bits or more), a value of "n+64N" is outputted, which is different from the above actual phase difference time "n+63N". Then, the subtractor 72 subtracts the output signal "N" outputted from the output DFF 71 from the output signal "n+64N" outputted from the output DFF 70, and outputs a 16-bit digital value as an actual phase difference time of "n+63N".

Now, the four improvements realized by this embodiment will be detailed as follows:

The layout of the ring delay pulse generating circuit 10 reflecting the first improvement will be detailed with reference to FIG. 3.

In a ring delay pulse generating circuit 10 which is integrated with other circuits into a single semiconductor circuit chip, the NAND gate and inverters IN1 through IN62 both of which are used as delay elements are continuously and serially connected, and the output from the inverter IN62 in the last stage is connected to the NAND gate in the first stage. A total of 63 delay elements (comprising the NAND gate and the inverters IN1 through IN62) are circularly connected to form a ring.

Figure 4:
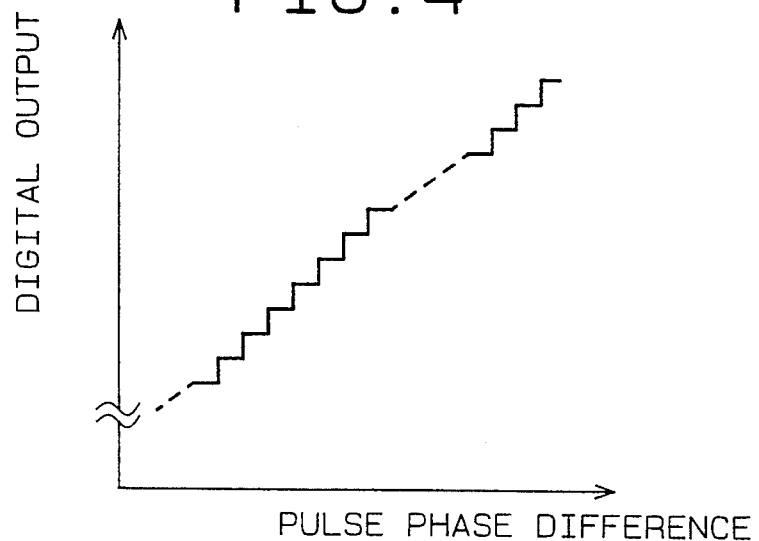
FIG. 4 is a graph illustrating the relationship between pulse phase difference and digital output value for indicating small differences in time resolutions in the first embodiment.
Figure 13:
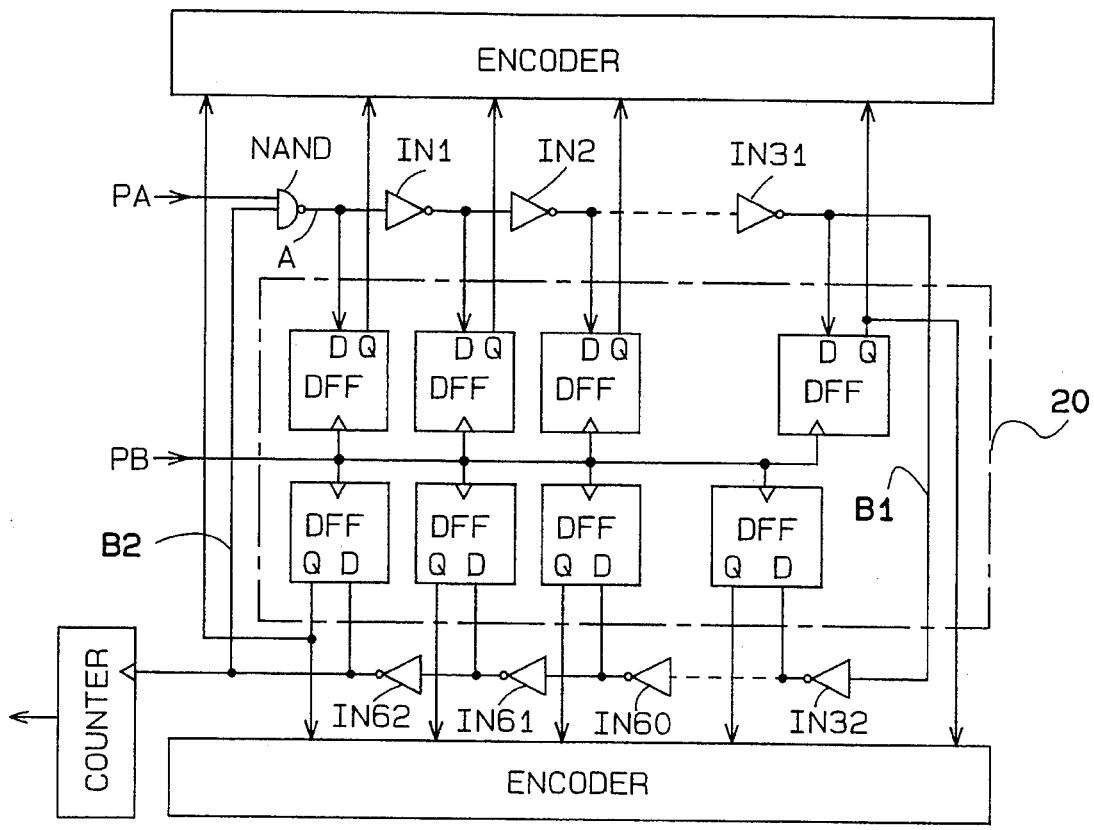
FIG. 13 is a schematic diagram illustrating a ring delay pulse generating circuit according to prior art.
Figure 14:
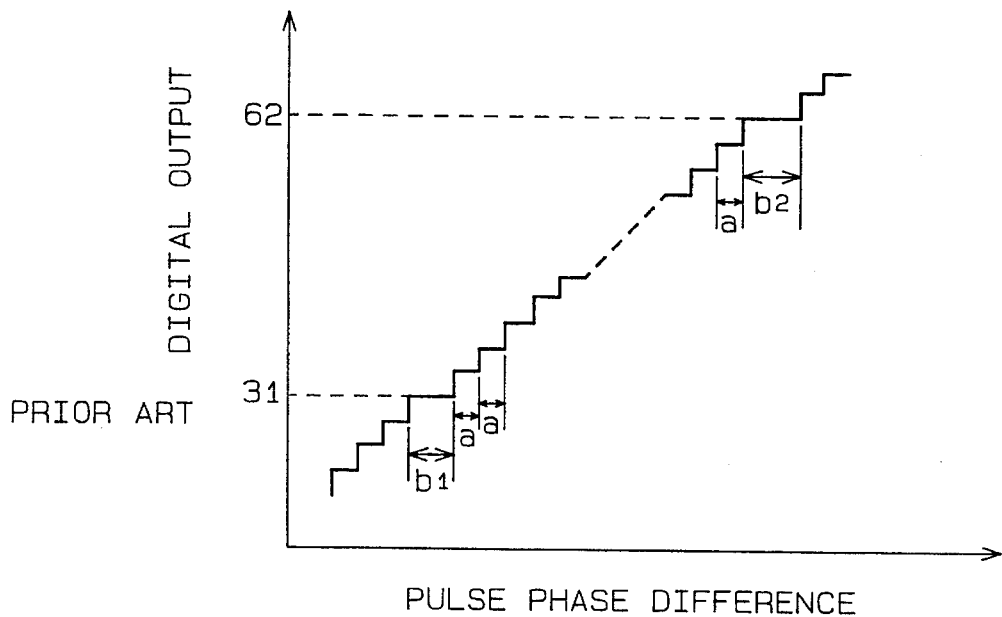
FIG. 14 is a graph illustrating differences in time resolutions in the prior art device of FIG. 13.
Figure 15:
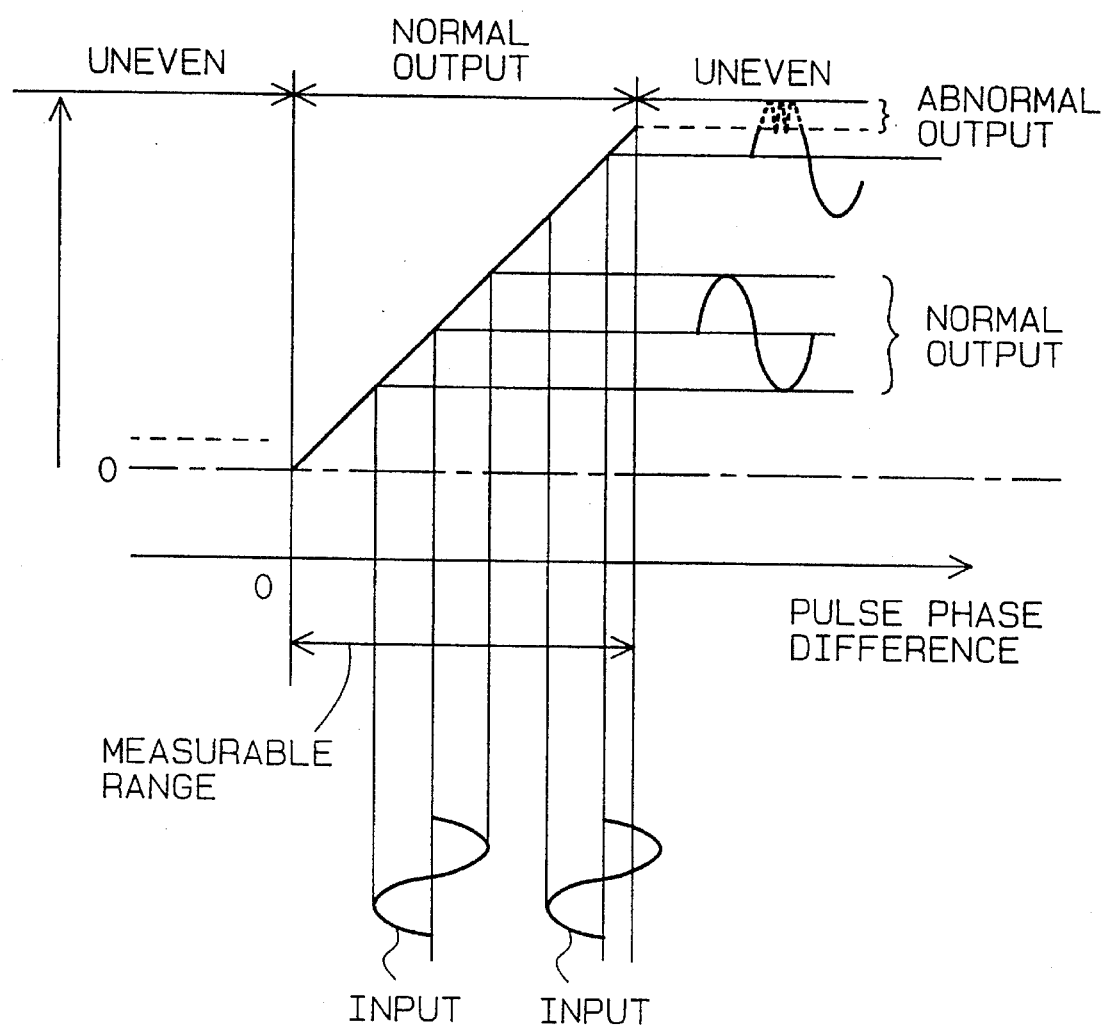
FIG. 15 is a chart illustrating an overflow condition in the prior art device of FIG. 13.
Figure 16:
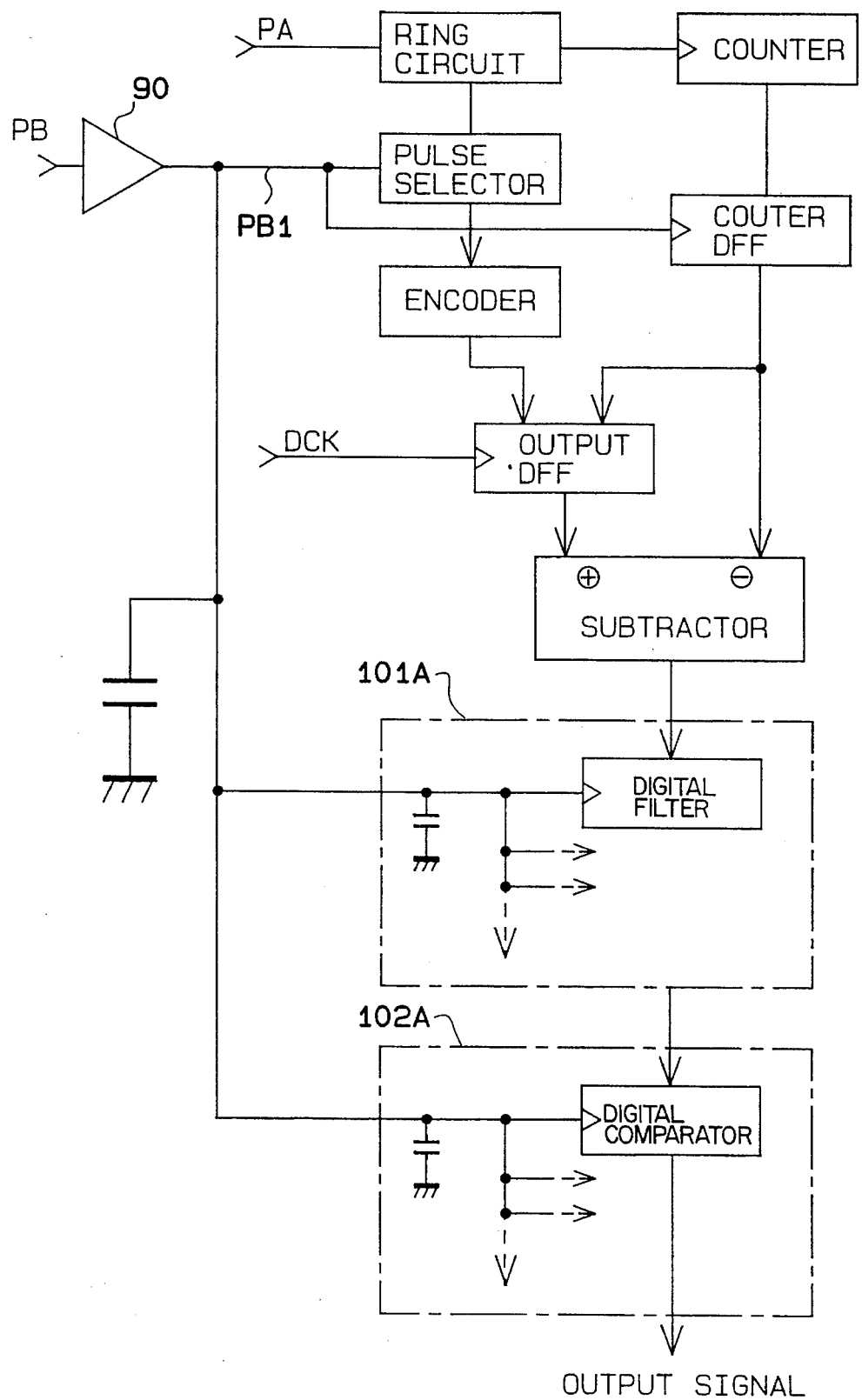
FIG. 16 is a diagram illustrating the use of a common buffer 90 in the prior art device of FIG. 13.

Here, straight signal lines connecting a plurality of delay elements (between the NAND gate and the inverter IN1, the inverter IN1 and the inverter IN2, and so on) are referred to as "signal lines A", the signal line connecting the delay elements at the first turn (between the inverter IN31 and the inverter IN32) is referred to as "signal line B1", and the signal line connecting the inverter IN62 in the last stage and the NAND gate in the first stage is referred to as "signal line B2". The connections are characterized by an arrangement where each signal line A, B1 and B2 has the same width and length so as to be almost equal in load capacitance to each other. Furthermore, by not laying out DFFs for the pulse selector 20 and other components within the ring area defined by the signal lines A, B1 and B2 but laying them outside the ring area, in contrast to the teaching of FIG. 13, the lengths of the signal lines A, B1 and B2 can be minimized. As a result, the load capacitance of each signal line A, B1 or B2 can be reduced and be made equal to each other, and thereby the delay pulses C1 through C63 can be steeply outputted one after another of even time intervals. The relationship between the pulse time difference and the digital outputs in the above circuit arrangement is illustrated in FIG. 4. As evident from this Figure, the time resolutions can be evenly at any digital output value.

Moreover, the load capacitance of the signal line is proportional to the width and length thereof. Based on this principle, the load capacitance can be reduced by narrowing the width of the signal line, as well as by reducing the length thereof as described above.

In FIG. 3, the time resolution of the delay pulse generating circuit is dependent on a delay time I of each straight signal line A and a delay time II of each turned signal line B (B1, B2). The delay time I is a sum of a delay time Ti of one inverter and a delay time TA of the signal line A between the two inverters (I=Ti+TA), while the delay time II is a sum of the delay time Ti of one inverter and a delay time TB of the turned signal line B (II=Ti+TB). The delay times Ti, TA and TB are determined by the internal resistance of the inverters and the capacitance (determined by the signal line length) of the signal lines A and B.

In the foregoing embodiment, the relationship between the delay times Ti and TA is approximately Ti=5×TA.

The time resolution of the pulse generating circuit is to be determined in accordance with the type of product to which it is applied. In the case of general-purpose products such as rotational speed sensors, the delay time II should be longer than the delay time I but may be less than or equal to twice the delay time I. This relationship is defined as follows.

$$II \leq 2 \times I$$

$$Ti+TB \leq 2(Ti+TA)$$

$$5TA+TB \leq 2(5TA+TA)$$

$$TB \leq 7TA$$

Therefore, as long as the line widths of the signal lines A and B are uniform or the same as each other, the line length LB of the signal line B should be equal to or shorter than 7 times the line length LA of the signal line A.

If a more improved time resolution is desired, the delay time II should be longer than the delay time I but should be less than or equal to 1.5 times the delay time I. By mathematical calculation similar to the ones above, the line length LB of the signal line should be less than or equal to 4 times the line length LA of the signal line A.

Figure 5:
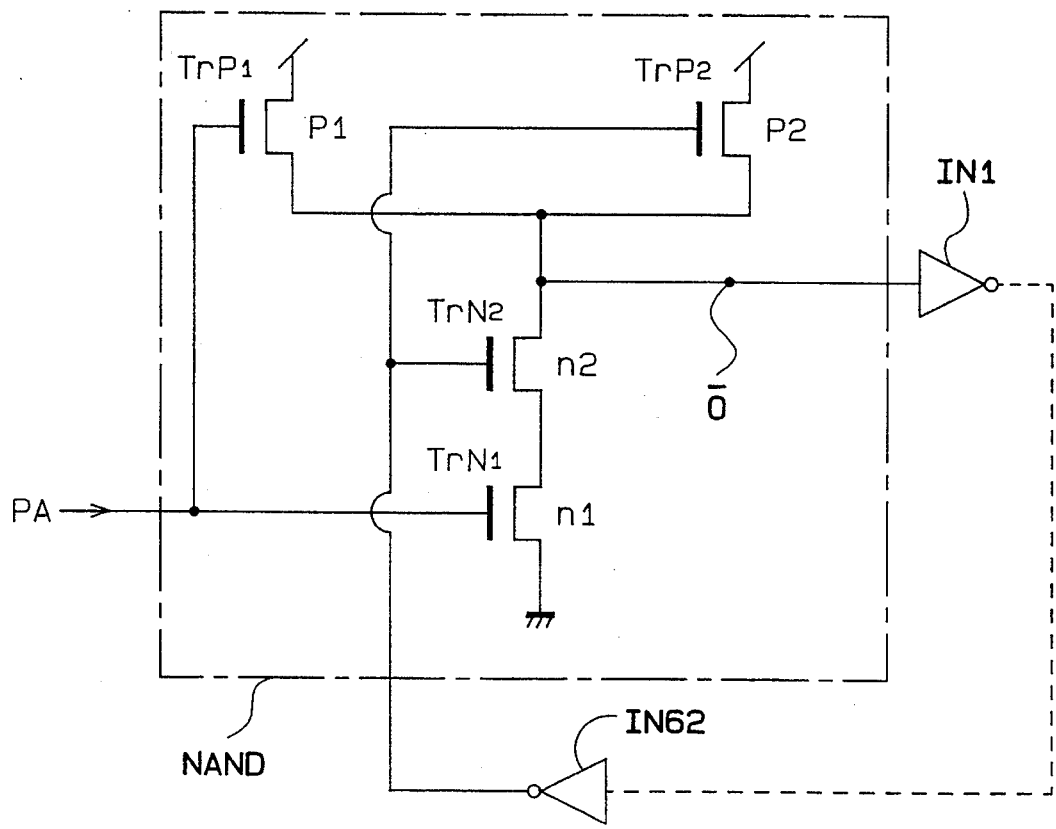
FIG. 5 is a circuit diagram illustrating a NAND gate according to a second embodiment of the present invention.

Next, the second improvement is described with reference to FIG. 5. This Figure illustrates transistors which compose the NAND gate of the ring delay pulse generating circuit 10. This improvement is in that the transistors of the NAND gate and those of the inverters IN1 through IN62 are properly downsized so as to make the time resolutions almost even.

The NAND gate comprises four transistors TrP1, TrP2, TrN1 and TrN2. The transistors TrP1 and TrP2 are connected to each other in parallel, while the transistors TrN1 and TrN2 are connected to each other in series. The output from the buffer driven by the first pulse signal PA is connected to the gate electrodes of the transistors TrP1 and TrN1, and the output from the last inverter IN62 is connected to the gate electrodes of the transistors TrP2 and TrN2, while the drain electrode of the transistor TrN2 is connected to the gate electrode of the first inverter IN1. When the transistor sizes of the transistors TrP1, TrP2, TrN1 and TrN2 are denoted as p1, p2, n1 and n2 respectively, the transistor sizes of the inverters IN as in, the width of the transistor channel as W, and the length of the transistor channel as L, the relation between these transistor sizes are: p1=Wp1/Lp1, p2=Wp2/Lp2, n1=Wn1/Ln1, n2=Wn2/Ln2 and in=Win/Lin. From the relationship between these transistor sizes, there is a difference caused in the time resolutions around the last stage for each cycle.

Figure 6:
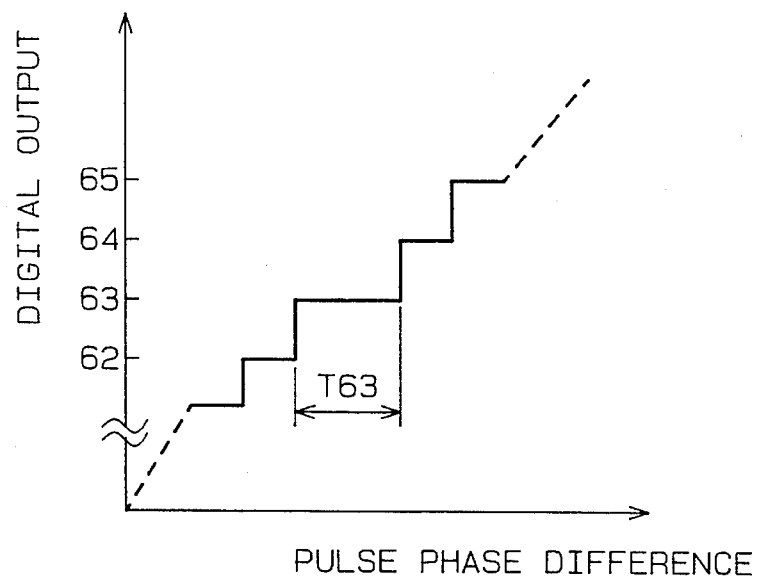
FIG. 6 is a graph illustrating the relationship between pulse phase difference and digital output value in the second embodiment.

For example, in the transistor sizes of the transistors TrN1 and TrN2 and inverters IN, under a condition of n1=n2=in, the time required to indicate a digital value of 63, T63, is approximately twice as long as the normal time until the NAND circuit switches as illustrated in FIG. 6, and as a result, even time resolutions can not be obtained. This is because the switching time of the NAND circuit is determined by the internal resistances of the two transistors TrN1 and TrN2 (which are inversely proportional to the widths of the transistor channels), while the switching times of the inverters IN are determined by the internal resistance of a transistor section forming each of the inverters IN. More specifically, when the circulation pulse from the inverter IN62 turns on the transistor TrN2 of the NAND circuit, an electric charge from the output O is discharged through the internal resistances of the two transistors TrN1 and TrN2, and the NAND circuit switches from "1" to "0" (while the transistor TrN1 remains ON). At this time, assuming the sizes of the transistors TrN1 and TrN2 are equal to each other (n1=n2=in), the internal resistances thereof turn to be in the serially connected state. These internal resistances of the transistors TrN1 and TrN2 sum up to be approximately twice as much as those of the inverters IN, and as a result, the switching time of the NAND circuit becomes approximately twice as long as the reversing times of the inverters IN. Although in actual use, the switching times are related to the parasitic load capacitances on internal resistances and signal lines, all the signal lines are arranged to be equal in length to each other in this preferred embodiment as mentioned above. Therefore, the load capacitances are assumed to be equal to those of the NAND gate and inverters, and further description thereof will not be given herein.

On the other hand, when the widths W of these two transistors TrN1 and TrN2 of the NAND circuit, Wn1 and Wn2, are increased to be twice as large as the width of the transistor channel, W, of the inverter IN62, Win (Wn1=Wn2=Win×2), so that the internal resistances of the serially-connected transistors TrN1 and TrN2 can be equal to those of the transistors of the inverters IN, and the internal resistances of the transistors TrN1 and TrN2 are reduced by half, the time T62 indicating a digital value of 62 becomes twice as long as the time indicating the other digital values. This is because the load capacitance of the transistor TrN2 which is turned on by the inverter IN62 is approximately doubled.

Based on the above, when the width of the transistor channel, W, of the transistor TrN1 of the NAND circuit, Wn1, is k times as large as that of the channel of the transistor TrN2 (or the inverter IN62), Wn2, i.e., Wn1=k×Wn2, where k is greater than or equal to 2, and the widths of the transistor channels, W, of the transistor TrN2 and inverters IN, Wn2 and Win, Wn2=Win, the time T63 indicating a digital value 63 becomes "1+1/k" times as long as the time indicating any other digital value. When the specified multiple k is set to be 2, 4 or 10, the time indicating a digital value 63 can be approximately 1.5 times, approximately 1.25 times or approximately 1.1 times as long as the time indicating any other digital value. That is, the time indicating a digital value of 63 can substantially be equal to the output time indicating any other digital value by selecting the appropriate specified multiple k, and thereby the time resolutions of the whole measurement range can be almost even. In practical use, however, as the time resolutions of the whole measurement range are determined by the capacitances of the time resolutions in the stages before and after the NAND circuit, a circuit adhering to required time resolution specifications can be designed by properly setting the size of the transistor TrN1, Wn1.

Figure 7:
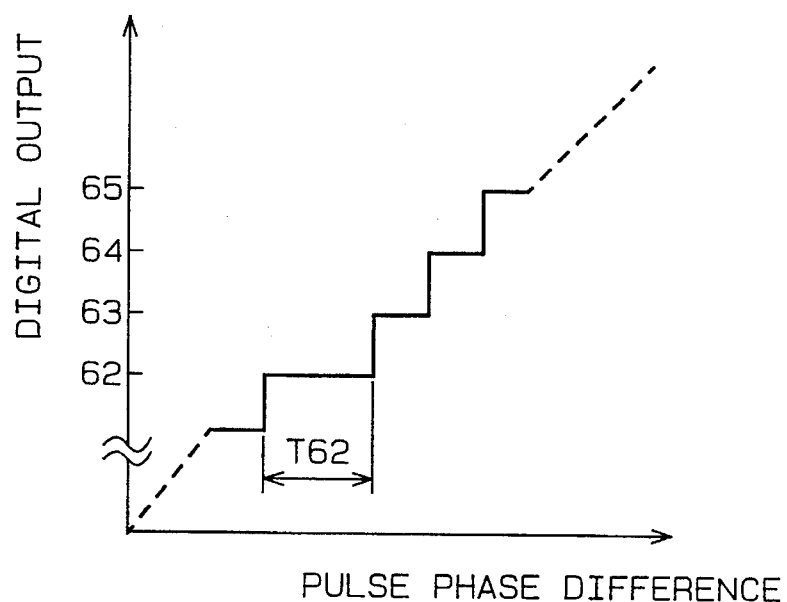
FIG. 7 is a graph illustrating the relationship between pulse phase difference and digital output value in the second embodiment.
Figure 8:
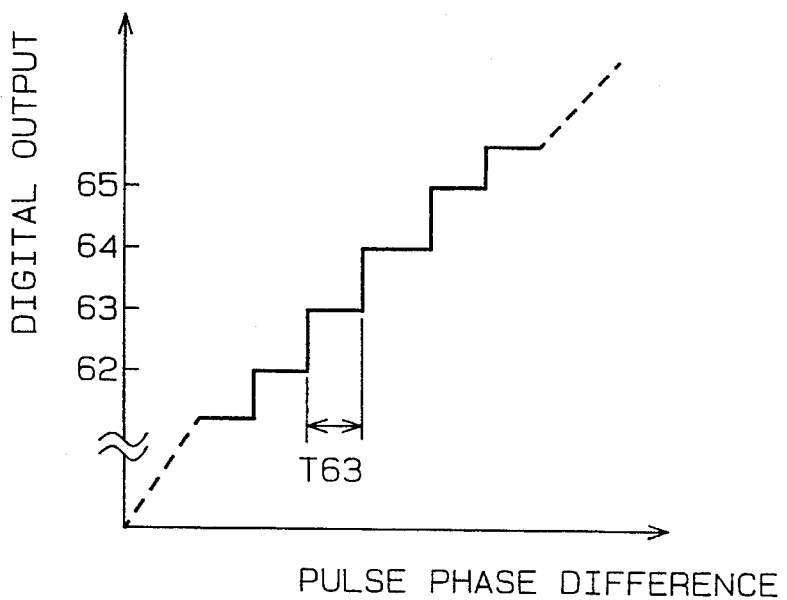
FIG. 8 is a graph illustrating the relationship between pulse phase difference and digital output value in the second embodiment.

That is, the time resolution signals which vary at each output as illustrated in FIGS. 6 and 7 can be controlled to be almost even as illustrated in FIG. 8 by widening the width of the transistor channel of only transistor TrN1, Wn1, which forms part of the delay element in the first stage of the ring pulse generating circuit 10 so that it is a specified number of times as wide as that of the transistor TrN2, Wn2, which is connected to the inverter IN62 in the last stage, and by arranging the width of the transistor channel of the transistor TrN2, Wn2, to be equal to that of the transistor TrN2.

Figure 9:
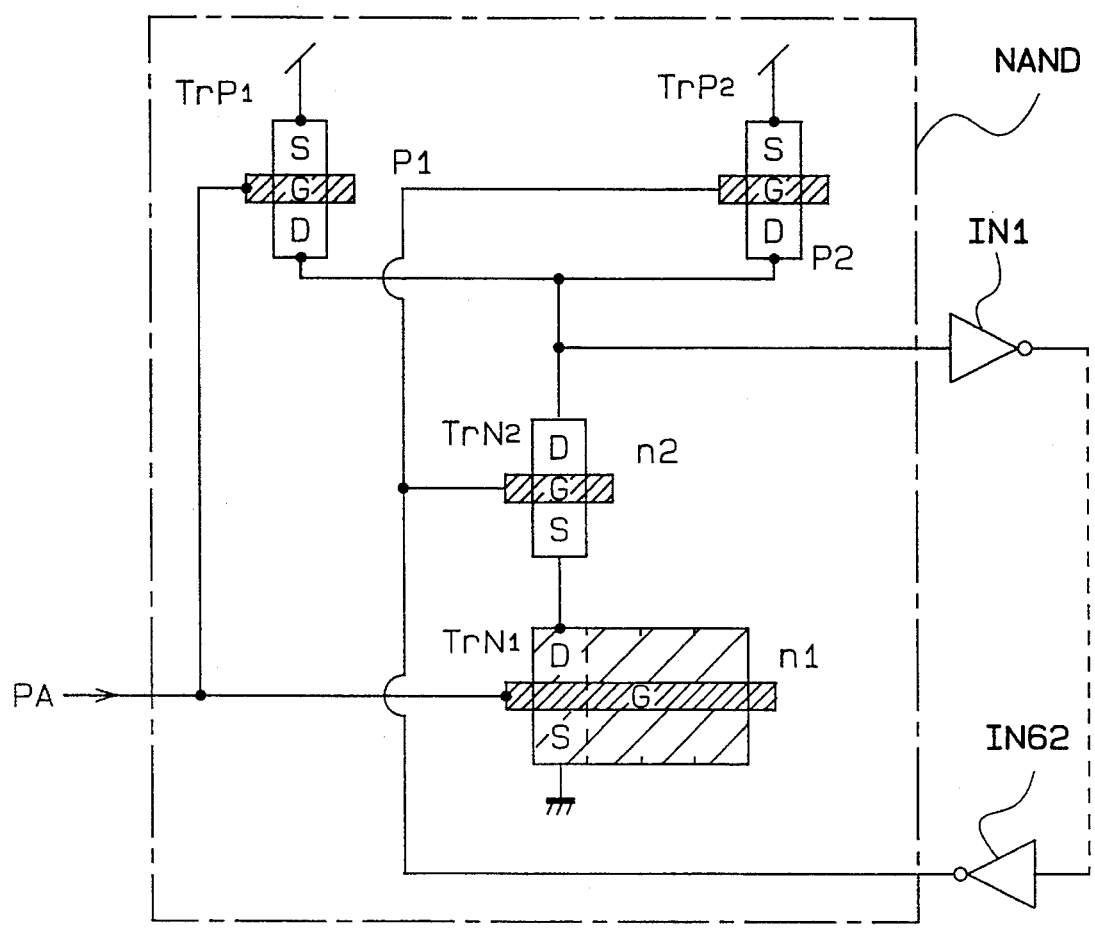
FIG. 9 is a layout image diagram of a NAND gate according to the second embodiment.

FIG. 9 illustrates the layout image of the NAND circuit in an integrated circuit with the transistor channel width for the transistor TrN1, Wn1, arranged to be four times as wide as that for the transistor TrN2, Wn2. In this Figure, S, G and D, respectively, denote a source, gate and drain of a transistor.

The above NAND circuit may be replaced by a NOR circuit comprising four transistors in a conventional configuration. In this instance, one transistor whose gate is connected to receive input pulse PA and which is connected to the inverter IN1 serially through another transistor connected to the inverter IN 62 may be configured differently from the other three transistors so that the delay time may be reduced. That is, the gate width of the above transistor receiving the pulse PA may be wider than those of the other three transistors.

The third improvement is that the latch pulses of the circuits illustrated in FIG. 1 are driven by the dedicated latch buffer 90 so that the latch pulses used to drive the pulse selector 20 and the counter DFF 50 can be steep. The buffer 90 is connected to a signal line in which the second pulse signal PB is inputted to drive only the pulse selector 20, the counter DFF 50 and the underflow DFF.

Figure 10:
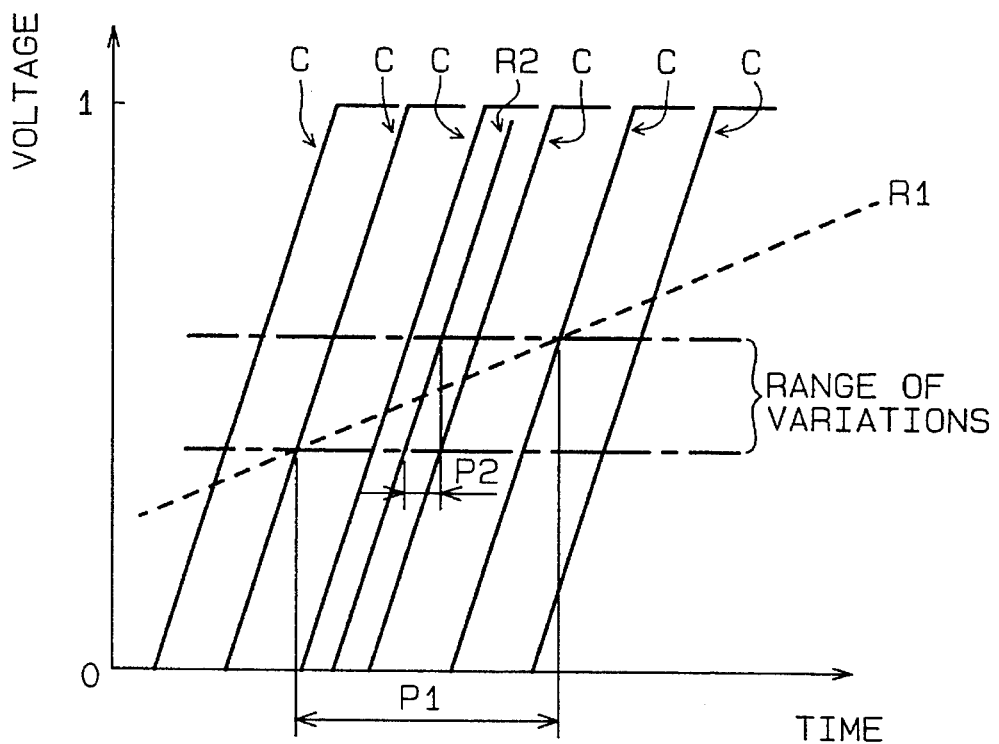
FIG. 10 is a timing diagram illustrating a gate delay and the waveform of a latch pulse according to a third embodiment of the present invention.

As described above, the pulse selector 20 inputs the delay pulses C1 through C63 one after another from the ring delay pulse generating circuit 10, and selects one delay pulse by using latch pulses from the buffer 90. As illustrated in FIG. 10, the ring delay pulse generating circuit 10 outputs the delay pulses C one after another at the delay times of the inverters IN (ranging from tens of picoseconds to hundreds of picoseconds). Incidentally, though the actual delay pulses are outputted accompanied by alternating rises and falls, FIG. 10 illustrates only the rising delay pulses for clarity.

If the load capacity of the wiring line is large and the latch pulse R1 becomes dull (not steep) as indicated by the broken line in FIG. 10, the data at each DFF of the pulse selector 20 will be uncertain. That is, due to difference in the switching level of each DFF, it is difficult to precisely determine the delay pulse in the zone P1 (a zone in which the latch pulses differ within the switching level) as illustrated in FIG. 10.

If the dedicated latch buffer 90 is used, however, since the latch pulse R2 will be steep as indicated by the solid line in FIG. 10, the zone of uncertainty will be smaller as shown by P2, and as a result a sufficient margin of error can be secured in practice and the precision of the data will be reliable.

Furthermore, since the values of the pulse selector 20 and counter DFF 50 are determined upon the input of the second pulse signal PB, the counter DFF 50 is also driven by the dedicated latch buffer 90 for the same reason. However, the counter DFF 50 does not output signals at such short intervals as those of the delay pulses outputted from the ring delay pulse generating circuit 10 (since the count is made every time a pulse circulates through the 63 delay elements of the ring delay pulse generating circuit 10), even if a dedicated latch buffer is not used for driving the counter DFF 50, there would be no practical problem. Nevertheless, since the load capacitance is small, the use of a dedicated latch buffer as used in this embodiment can improve the performance.

Now, as the fourth improvement, the underflow limiter circuit 60 and the overflow limiter circuit 80 will be described.

In FIG. 1, the underflow limiter circuit 60 comprises a multiplexer 61 and an underflow DFF 62. The multiplexer 61 switches the phase difference signal of the encoder 30 to the fixed value signal "000000" preset to indicate underflow and outputs the switched signal. Normally, i.e., when the second pulse signal PB is inputted later than the first pulse signal PA, the multiplexer 61 outputs the phase difference signal from the encoder 30. Conversely, when the second pulse signal PB is inputted earlier than the first pulse signal PA, as the underflow DFF 62 outputs the underflow signal MS to the multiplexer 61, the multiplexer 61 and outputs the underflow signal "000000".

As shown in FIG. 2, the overflow limiter circuit 80 comprises a multiplexer 81, an overflow DFF 82 and an RSFF 83. The multiplexer 81 switches the output from the subtractor 72 to the output value from the overflow DFF 82 and outputs the switched value. The DFF 82 outputs the signal from the multiplexer 81 by using the clock signal DCK. The RSFF 83 is set by the leading edge of the signal from the output terminal Q10 of the counter DFF 50, and reset by the trailing edge of the signal of the first pulse signal PA. Normally, i.e., when the output signal RSOV from the RSFF 83 is not "1", the RSFF 83 outputs the signal from the subtractor 72. When the output signal RSOV from the RSFF 83 is "1", the RSFF 83 outputs the output value of the overflow DFF 82, i.e., the value prior to overflow.

Figure 11:
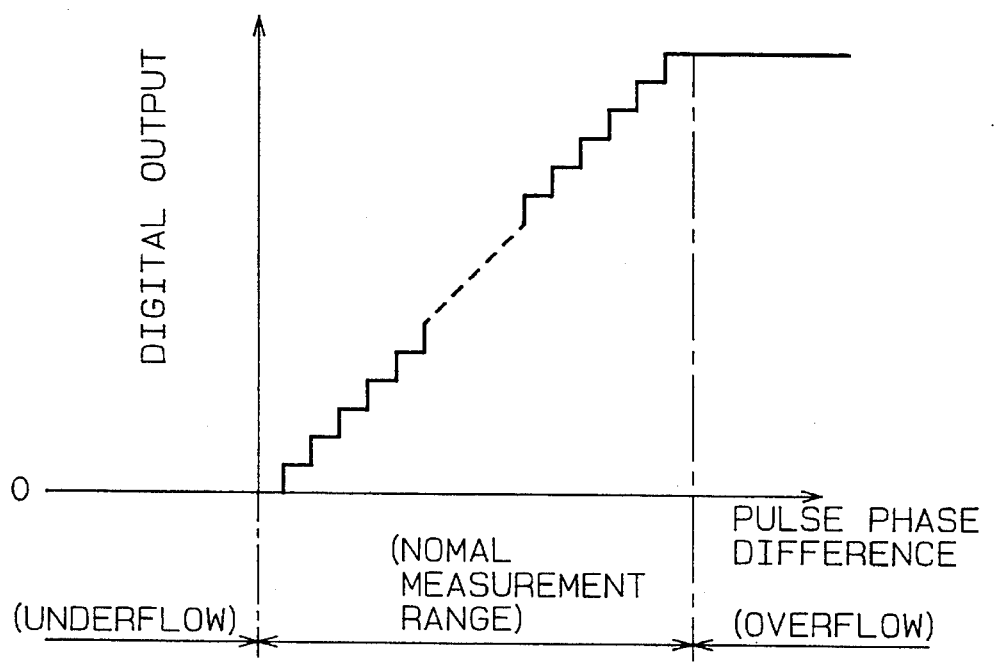
FIG. 11 is a graph illustrating a time measurement range according to a fourth embodiment of the present invention and an underflow/overflow range according to the fourth embodiment of the present invention.

In order to clarify the above fourth improvement, the circuit operation is divided into three segments. As illustrated in FIG. 11, the first case (normal measurement range) is a case where the first pulse signal PA and then the second pulse signal PB are inputted within the time of measurement with the pulse phase difference encoding circuit. The second case (overflow) is a case where the second pulse signal PB is inputted beyond the measurement time range after the first pulse signal PA is inputted. The third case (underflow) is a case where the second pulse signal PB is inputted before the first pulse signal PA is inputted.

Within the normal measurement range, when the first pulse signal PA is inputted, the phase difference pulses C1 through C63 are outputted one after another from the ring delay pulse generating circuit 10 as the first pulse signal PA proceeds, and every time the first pulse signal PA makes a complete circulation through the ring delay pulse generating circuit 10, the circulation counter 40 is incremented. Then, when the second pulse signal PB is inputted, the pulse selector 20 selects one of the phase difference pulses C1 through C63 inputted at the timing of the second pulse signal PB, and outputs the selected phase difference pulse C to the encoder 30. The encoder 30 in turn outputs the binary phase difference signal corresponding to the selected phase difference pulse. The outputted binary phase difference signal is inputted as the least significant bits of the output DFF 70 and through the multiplexer 61 in the underflow limiter circuit 60.

On the other hand, when the second pulse signal PB is inputted, the counter DFF 50 latches the count value of the circulation counter 40, and outputs the count value as the most significant bits of the output DFF 70 and to the output DFF 71. The output DFF 70 combines the most and least significant bits upon the input of the clock signal DCK, and outputs the result to the subtractor 72, while the output DFF 71 outputs the signal from the counter DFF 50 upon the input of the clock signal DCK. As described above, the subtractor 72 calculates the actual phase difference signal from both the output DFFs 70 and 71 by subtracting, and outputs a 16-bit digital value. The output signal from the subtractor 72 is outputted to the overflow DFF 82 through the multiplexer 81. The digital value indicating the phase difference between the first pulse signal PA and the second pulse signal PB is outputted from the output DFF 82 as a phase difference data signal. Incidentally, the second pulse signal PB may be used as clock signal DCK.

Figure 12:
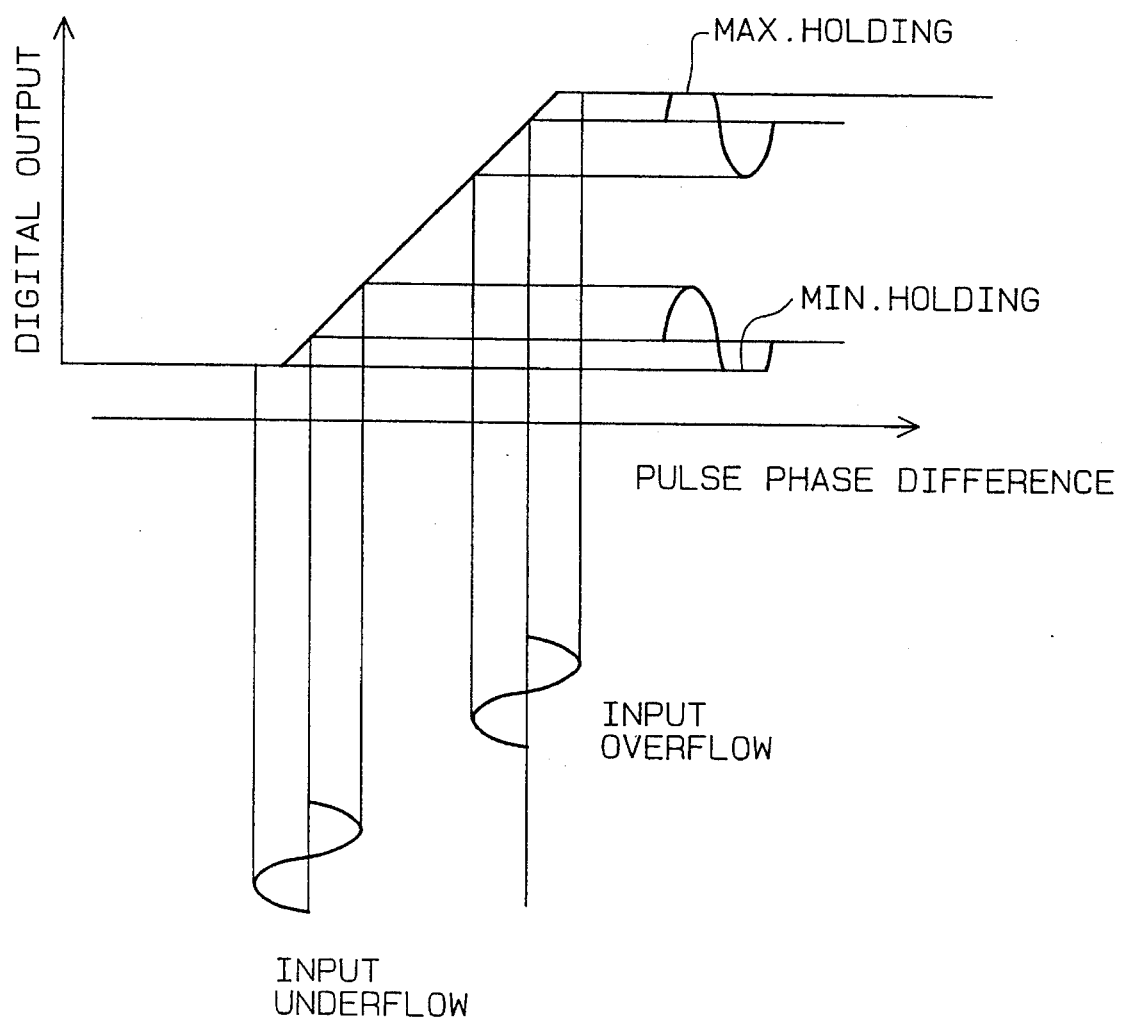
FIG. 12 is a graph illustrating the correspondence between underflow and overflow in the fourth embodiment.

In the event of overflow, since the number of signal circulations in the ring delay pulse generating circuit 10 from the first pulse signal PA to the second pulse signal PB exceeds the measurement range, the most significant bit of the output from the circulation counter 40 becomes "1". Here, when the second pulse signal PB is inputted in the ring delay pulse generating circuit 10, the output terminal Q10 of the counter DFF 50 outputs "1". This makes the output signal RSOV of the RSFF 83 "1". When the multiplexer 81 switches the output from the subtractor 72 to the output from overflow DFF 82, the final output becomes the phase difference data signal immediately before overflow. Therefore, as illustrated in FIG. 12, the overflow range holds and outputs the value measured within the normal measurement range. Furthermore, when the second pulse signal PB remains uninputted for a longer time, the output terminal Q10 of the counter DFF 50 returns to "0". On the other hand, since the output terminal RSOV of the RSFF 83 remains at a '1' state until the first pulse signal is inputted again, the multiplexer 81 outputs the output of the overflow DFF 82 as the final output.

In the event of underflow, as the input of the second pulse signal PB comes before the input of the first pulse signal PA, the underflow DFF 62 outputs the underflow signal MS to the multiplexer 61. This makes the multiplexer 61 output the underflow signal "000000". Since the count value of the circulation counter 40 is "0", the final output becomes the phase difference output data with all zeroes. Accordingly, as illustrated in FIG. 12, "0" is outputted in the underflow range.

As aforementioned, the overflow limiter circuit 80 holds the previous value in the event of overflow. However, all the bits may be set to "1" as the fixed value indicating overflow by modifying the connection of the multiplexer.

The present invention should not be limited to the embodiment described above but may be modified in many ways without departing from the spirit of the present invention.

We claim:

1. A pulse phase difference encoding circuit comprising:

a ring delay pulse generating circuit, including a plurality of delay means connected in series to form a ring circuit, for receiving a first pulse signal and for passing said first pulse signal through said plurality of delay means;

a plurality of signal lines respectively connecting each of said plurality of delay means to an adjacent one of said plurality of delay means, a width and a length of each of said plurality of signal lines being such that load capacitances of each of said plurality of signal lines are substantially equal to each other; and encoding means, connected to said ring delay pulse generating circuit, for receiving a second pulse signal delayed by a delay time from said first pulse signal received by said ring delay pulse generating circuit, for specifying respective positions of said plurality of delay means through which said first pulse signal passes at receipt of said second pulse signal, and for encoding said pulse phase difference based on a number of said plurality of delay means through which said first pulse signal has passed.

2. A pulse phase difference encoding circuit according to claim 1, wherein:

said pulse phase difference encoding circuit is disposed on a single semiconductor chip;

said ring delay pulse generating circuit defines an interior portion therein and an exterior portion separate from said interior portion; and said encoding means is disposed in said exterior portion of said ring delay pulse generating circuit.

3. A pulse phase difference encoding circuit according to claim 1, wherein at least one of said plurality of signal lines is longer and narrower than others of said plurality of signal lines.

4. A pulse phase difference encoding circuit according to claim 1, said plurality of signal lines comprising:

a sub-plurality of straight signal lines each connecting two adjacent collinear ones of said plurality of delay means; and a sub-plurality of bent signal lines each connecting adjacent non-collinear ones of said plurality of delay means;

wherein a length of each of said a sub-plurality of bent signal lines is less than seven times a length of each of said sub-plurality of straight signal lines.

5. A pulse phase difference encoding circuit according to claim 4, wherein said length of each of said sub-plurality of bent signal lines is less than four times said length of each of said sub-plurality of straight signal lines.

6. A pulse phase measurement signal generating circuit according to claim 1, said ring delay pulse generating circuit comprising:

a logic gate including a plurality of transistors; and a plurality of inverters;

wherein one transistor of said plurality of transistors of said logic gate is for receiving said first pulse signal; and a gate of said one transistor has a width wider than widths of respective gates of others of said plurality of transistors.

7. A pulse phase measurement signal generating circuit according to claim 1, said ring delay pulse generating circuit comprising:

a NAND gate including a plurality of transistors; and a plurality of inverters;

wherein one transistor of said plurality of transistors of said NAND gate is for receiving said first pulse signal; and said one transistor is configured differently from others of said plurality of transistors such that said NAND gate has a same signal delay time as a signal delay time of each of said plurality of inverters.

8. A pulse phase measurement signal generating circuit according to claim 7, wherein said one transistor has a channel width greater than channel widths of said others of said plurality of transistors.

9. A pulse phase difference encoding circuit comprising:

a ring delay pulse generating circuit, including a plurality of delay means connected in series to form a ring circuit, for receiving a first pulse signal and for passing said first pulse signal through said plurality of delay means;

a plurality of signal lines respectively connecting each of said plurality of delay means to an adjacent one of said plurality of delay means, a width and a length of each of said plurality of signal lines being such that load capacitances of each of said plurality of signal lines are substantially equal to each other, at least one of said plurality of signal lines being longer and narrower than others of said plurality of signal lines; and encoding means, connected to said ring delay pulse generating circuit, for receiving a second pulse signal delayed by a delay time from said first pulse signal received by said ring delay pulse generating circuit, for specifying respective positions of said plurality of delay means through which said first pulse signal passes at receipt of second pulse signal, and for encoding said pulse phase difference based on a number of said plurality of delay means through which said first pulse signal has passed;

wherein said ring delay pulse generating circuit includes a logic gate including a plurality of transistors, and a plurality of inverters;

one of said plurality of transistors of said logic gate being for receiving said first pulse signal; and a gate of said one transistor having a width wider than widths of respective gates of said others of said plurality of transistors.

10. A pulse phase difference encoding circuit comprising:

a ring delay pulse generating circuit, including a plurality of delay means connected in series to form a ring circuit, for receiving a first pulse signal and for passing said first pulse signal through said plurality of delay means;

a plurality of signal lines respectively connecting each of said plurality of delay means to an adjacent one of said plurality of delay means, a width and a length of each of said signal lines being such that load capacitances of each of said plurality of signal lines are substantially equal to each other, at least one of said plurality of signal lines being longer and narrower than others of said plurality of signal lines; and encoding means, connected to said ring delay pulse generating circuit, for receiving a second pulse signal delayed by a delay time from said first pulse signal received by said ring delay pulse generating circuit, for specifying respective positions of said plurality of delay means through which said first pulse signal passes at receipt of said second pulse signal, and for encoding said pulse phase difference based on a number of said plurality of delay means through which said first pulse signal has passed;

wherein said ring delay pulse circuit includes a NAND gate including a plurality of transistors, and a plurality of inverters;

one of said plurality of transistors of said NAND gate being for receiving said first pulse signal; and said one transistor being configured differently from others of said plurality of transistors of said NAND gate so that said NAND gate has a same signal delay time as each of said plurality of inverters.

11. A pulse phase difference encoding circuit according to claim 10, wherein said one transistor has a channel width greater than respective channel widths of said others of said plurality of transistors of said NAND gate.

12. A pulse phase difference encoding circuit comprising:

a ring delay pulse generating circuit, including a plurality of first delay means and a second delay means which are connected in series to form a ring, said second delay means being for receiving a first pulse signal and said first delay means being for passing said first pulse signal through said plurality of first delay means to said second delay means; and an encoder circuit connected to said ring delay pulse generating circuit, for receiving a second pulse signal delayed by a delay time delayed from receipt of said first pulse signal by said ring delay pulse generating circuit, and for specifying positions of each of said plurality of first delay means through which said first pulse signal passes at receipt of said second pulse signal, and thereby encoding said delay time based on a number of said plurality of delay means through which said first pulse signal has passed;

wherein said second delay means includes a plurality of switching elements, a first one of said plurality of switching elements receiving said first pulse signal and having an element width wider than a corresponding element width of others of said plurality of switching elements.

13. A pulse phase difference encoding circuit according to claim 12, wherein said first one of said switching elements is disposed between a ground and a remainder of said second delay means and is connected in series with a second one of said plurality of switching elements.

14. A pulse phase difference encoding circuit comprising:

a delay pulse generating circuit including a plurality of delay means, for passing an input first pulse signal therethrough, and for repetitively generating a plurality of delay pulse signals one after another delayed by a delay time corresponding to each of said plurality of delay means;

a pulse selector connected to said delay pulse generating circuit, for selecting, at a timing of a second pulse signal having a phase difference with respect to said first pulse signal, a delay pulse signal from among said plurality of delay pulse signals having a specific relationship to said phase difference; and a dedicated buffer receiving said second pulse signal and applying a drive pulse signal to said pulse selector to independently drive said pulse selector.

15. A pulse phase difference encoding circuit according to claim 14, further comprising:

a counter counting a number of circulations of said first pulse signal through said delay pulse generating circuit; and a counter flip-flop receiving said drive pulse signal and outputting a count signal of said counter corresponding to said number of circulations in synchronization with a timing of said drive pulse signal.

16. A pulse phase difference encoding circuit comprising:

a ring delay pulse generating circuit including a plurality of delay means connected in series to form a ring, for circulating a first pulse signal therethrough;

a counter counting a number of circulations of said first pulse signal through said plurality of delay means; and encoding means, connected to said ring delay pulse generating circuit and to said counter, for receiving a second pulse signal delayed by a delay time from said first pulse signal, and for encoding said pulse phase difference as an encoded delay time based on an output of said ring delay pulse generating circuit and an output of said counter, wherein said encoding means includes
judgment means for judging whether said encoded pulse phase difference is within a measurement range,
and output means for outputting a predetermined value when said judgment means judges that said encoded pulse phase difference exceeds said measurement range.

17. A pulse phase difference encoding circuit according to claim 16, said judgment means comprising:
- an underflow judgment means for judging whether said encoded delay time is less than a lower bound of said measurement range; and
- an overflow judgment means for judging whether said encoded delay time is greater than an upper bound of said measurement range.

18. A pulse phase difference encoding circuit according to claim 17, wherein said output means is for outputting a first predetermined value when said underflow judgment means judges that said encoded pulse phase difference is less than said lower bound of said measurement range, and for outputting a second predetermined value when said overflow judgment means judges that said encoded pulse phase difference is greater than said upper bound of said measurement range.

19. A pulse phase difference encoding circuit according to claim 17, wherein said underflow judgment means judges that said encoded pulse phase difference is less than said lower bound of said measurement range when said second pulse is received before said first pulse is received by said ring delay pulse generating circuit.

20. A pulse phase difference encoding circuit according to claim 17, wherein said overflow judgment means judges that said encoded pulse phase difference is greater than said upper bound of said measurement range when said encoded pulse phase difference exceeds a maximum range of said pulse phase difference encoding circuit.

21. A pulse phase difference encoding circuit according to claim 17, said underflow judgment means comprising:
- an underflow flip-flop receiving said first pulse as a data input and receiving said second pulse as a clock input; and
- a multiplexer having a control input connected to an output of said underflow flip-flop for selectively providing as an output one of a signal representative of an output of said ring pulse delay generating circuit and a predetermined underflow value, said multiplexer being responsive to said underflow flip-flop output.

22. A pulse phase difference encoding circuit according to claim 17, said overflow judgment means comprising:
- a flip-flop receiving said first pulse at a first input and receiving a most significant bit of said counter output; and
- a multiplexer having a control input connected to an output of said flip-flop, said multiplexer selectively providing as an output one of said encoded pulse phase difference delay time and a predetermined overflow value, and said multiplexer being responsive to said flip-flop output.

23. A pulse phase measurement signal generating circuit comprising:
- a ring delay pulse generating circuit, including a plurality of delay means connected in series to form a ring circuit, said ring delay pulse generating circuit for receiving a first pulse signal and for passing said first pulse signal through said plurality of delay means; and
- a plurality of signal lines respectively connecting each of said delay means to an adjacent one of said plurality of delay means, a width and a length of each of said plurality of signal lines being such that load capacitances of each of said plurality of signal lines are substantially equal to each other;
- wherein each of said plurality of delay means has an output line associated therewith, said output lines specifying positions of said plurality of delay means through which said first pulse signal passes at a timing of a second pulse signal.

24. A pulse phase difference encoding circuit according to claim 23, wherein at least one of said plurality of signal lines is longer and narrower than others of said plurality of signal lines.

25. A pulse phase measurement signal generating circuit according to claim 23, wherein:
- said plurality of signal lines comprise a sub-plurality of straight signal lines each connecting two adjacent collinear ones of said plurality of delay means, and a sub-plurality of bent signal lines each connecting adjacent non-collinear ones of said plurality of delay means; and
- a length of each signal line in said sub-plurality of bent signal lines is less than seven times a length of each signal line in said sub-plurality of straight signal lines.

26. A pulse phase measurement signal generating circuit according to claim 25, wherein said length of each signal line in said sub-plurality of bent signal lines is less than four times said length of each signal line in said sub-plurality of straight signal lines.

* * * * *

UNITED STATES PATENT AND TRADEMARK OFFICE
CERTIFICATE OF CORRECTION

PATENT NO. : 5,534,809

DATED : July 9, 1996

INVENTOR(S) : WATANABE et al.

It is certified that error appears in the above-identified patent and that said Letters Patent is hereby corrected as shown below:

On the face of the patent, under item [30] Foreign Application Priority Data, change "50-68019" to --5-68019--.

Signed and Sealed this

Twenty-fifth Day of March, 1997

*Attest:*

BRUCE LEHMAN

*Attesting Officer*     *Commissioner of Patents and Trademarks*